United States Patent
Lee et al.

(10) Patent No.: US 10,290,825 B2
(45) Date of Patent: May 14, 2019

(54) ORGANIC LIGHT EMITTING DIODE DISPLAY INCLUDING WHITE LIGHT EMITTING DIODES

(71) Applicant: SAMSUNG DISPLAY CO., LTD., Yongin, Gyeonggi-Do (KR)

(72) Inventors: Yonghan Lee, Seongnam-si (KR); Sungsoo Lee, Suwon-si (KR); Woosik Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/732,429

(22) Filed: Jun. 5, 2015

(65) Prior Publication Data
US 2016/0141538 A1    May 19, 2016

(30) Foreign Application Priority Data
Nov. 18, 2014 (KR) .......... 10-2014-0161018

(51) Int. Cl.
*H01L 29/04* (2006.01)
*H01L 29/10* (2006.01)
*H01L 31/00* (2006.01)
*H01L 51/50* (2006.01)
*H01L 51/52* (2006.01)
*H01L 27/32* (2006.01)

(52) U.S. Cl.
CPC .......... *H01L 51/504* (2013.01); *H01L 27/322* (2013.01); *H01L 51/5016* (2013.01); *H01L 51/5044* (2013.01); *H01L 51/5284* (2013.01); *H01L 2251/5376* (2013.01)

(58) Field of Classification Search
CPC . H01L 27/1214; H01L 27/12; H01L 51/0545; B82Y 10/00
USPC ..................................................... 257/40, 59
See application file for complete search history.

(56) References Cited

U.S. PATENT DOCUMENTS 7,279,704 B2    10/2007   Walters et al.
9,564,609 B2 *   2/2017   Sasaki
(Continued)

FOREIGN PATENT DOCUMENTS

CN    102365769 A    2/2012
CN    103872253 A    6/2014
(Continued)

OTHER PUBLICATIONS

EPO Search Report dated Apr. 13, 2016, for corresponding European Patent application 15181852.3, (10 pages).
(Continued)

*Primary Examiner* — Lex Malsawma
*Assistant Examiner* — Eric W Jones
(74) *Attorney, Agent, or Firm* — Lewis Roca Rothgerber Christie LLP

(57) ABSTRACT

An organic light emitting diode display includes: a substrate; a first electrode on the substrate; a second electrode opposed to the first electrode; a first light emitting unit and a second light emitting unit between the first electrode and the second electrode; and a charge generation layer between the first light emitting unit and the second light emitting unit. The first light emitting unit includes a blue fluorescent light emitting layer. The second light emitting unit includes a blue light emitting layer and a yellow light emitting layer.

17 Claims, 10 Drawing Sheets

(56) References Cited

U.S. PATENT DOCUMENTS

| | | | |
|---|---|---|---|
| 2003/0091862 A1* | 5/2003 | Tokito | C08G 61/02 428/690 |
| 2004/0247937 A1 | 12/2004 | Chen et al. | |
| 2005/0168137 A1 | 8/2005 | Adamovich et al. | |
| 2006/0082295 A1* | 4/2006 | Chin | H01L 27/322 313/506 |
| 2006/0187155 A1* | 8/2006 | Chang | G09G 3/3208 345/76 |
| 2007/0001587 A1* | 1/2007 | Hatwar | H01L 51/5036 313/504 |
| 2008/0278066 A1 | 11/2008 | Spindler et al. | |
| 2008/0284318 A1* | 11/2008 | Deaton | H01L 51/5016 313/504 |
| 2009/0122530 A1* | 5/2009 | Beers | F21K 9/00 362/230 |
| 2010/0066239 A1 | 3/2010 | Spindler et al. | |
| 2010/0314648 A1 | 12/2010 | Fehrer et al. | |
| 2011/0215714 A1* | 9/2011 | Seo | C09K 11/06 313/504 |
| 2011/0240971 A1* | 10/2011 | Nowatari | H01L 51/0078 257/40 |
| 2011/0260145 A1* | 10/2011 | Omary | C07D 401/04 257/40 |
| 2011/0309307 A1* | 12/2011 | Zeika | C07D 497/04 252/500 |
| 2012/0037896 A1 | 2/2012 | Kaiser et al. | |
| 2012/0097998 A1* | 4/2012 | Pieh | H01L 51/504 257/89 |
| 2012/0217515 A1 | 8/2012 | Yamazaki et al. | |
| 2012/0248971 A1 | 10/2012 | Okuyama | |
| 2012/0267618 A1* | 10/2012 | Monkman | H01L 51/0003 257/40 |
| 2013/0240859 A1* | 9/2013 | Arakane | C09K 11/06 257/40 |
| 2013/0320368 A1 | 12/2013 | Seo et al. | |
| 2013/0320837 A1 | 12/2013 | Weaver et al. | |
| 2014/0131665 A1* | 5/2014 | Xia | H01L 51/0072 257/40 |
| 2014/0145168 A1* | 5/2014 | Ohsawa | H01L 51/5016 257/40 |
| 2014/0167016 A1 | 6/2014 | Yoo et al. | |
| 2015/0034923 A1* | 2/2015 | Kim | H01L 51/5044 257/40 |
| 2015/0053939 A1* | 2/2015 | Adamovich | H01L 51/0054 257/40 |
| 2015/0054815 A1* | 2/2015 | Toyoda | G09G 3/3233 345/212 |
| 2015/0060776 A1 | 3/2015 | Chang et al. | |
| 2015/0108456 A1 | 4/2015 | Shin et al. | |
| 2015/0171356 A1* | 6/2015 | Nakamura | C09K 11/06 257/40 |
| 2015/0228932 A1* | 8/2015 | Ma | H01L 51/5004 257/40 |
| 2015/0295197 A1* | 10/2015 | Adamovich | H01L 51/5004 257/40 |
| 2015/0295199 A1* | 10/2015 | Yamamoto | H01L 51/5036 257/40 |

FOREIGN PATENT DOCUMENTS

| | | |
|---|---|---|
| KR | 10-2011-0074531 A | 6/2011 |
| KR | 10-2012-0077301 A | 7/2012 |
| KR | 10-2013-0135779 A | 12/2013 |

OTHER PUBLICATIONS

Chang, C., et al, *Highly efficient white organic electroluminescent devices based on tandem architecture*, Applied Physics Letters, vol. 87, No. 25, Dec. 12, 2005, pp. 253501-1-253501-3, XP012077011.

* cited by examiner

ORGANIC LIGHT EMITTING DIODE DISPLAY INCLUDING WHITE LIGHT EMITTING DIODES

CROSS-REFERENCE TO RELATED APPLICATION

This application claims priority to and the benefit of Korean Patent Application No. 10-2014-0161018, filed on Nov. 18, 2014, with the Korean Intellectual Property Office, the disclosure of which is incorporated herein in its entirety by reference.

BACKGROUND

1. Field

Aspects of embodiments of the present invention relate to an organic light emitting diode and to an organic light emitting diode display including the organic light emitting diode.

2. Description of the Related Art

An organic light emitting diode display (OLED display) is a self-emission type display device that displays an image using an organic light emitting diode (OLED) that emits light. OLED displays do not require a separate light source, in contrast to a liquid crystal display, thereby having a relatively small thickness and light weight. Further, the OLED displays have low power consumption, high luminance, and high speed of response, and thus have drawn attention as a next generation display device.

The OLED display may display an image using red, green, and blue OLEDs and may display an image using a plurality of white OLEDs and a color filter.

In order to express a high-definition image with the OLED display that displays an image using the white OLED and the color filter, among the above OLEDs, the white OLED needs to emit white light having a high color temperature.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to an organic light emitting diode that emits white light having a high color temperature.

Further, aspects of embodiments of the present invention are directed to an organic light emitting diode display including an organic light emitting diode that emits white light having a high color temperature.

According to an embodiment of the present invention, an organic light emitting diode display includes: a substrate; a first electrode on the substrate; a second electrode opposed to the first electrode; a first light emitting unit and a second light emitting unit between the first electrode and the second electrode; and a charge generation layer between the first light emitting unit and the second light emitting unit. The first light emitting unit includes: a first hole transport layer and a first electron transport layer opposed to each other; and a first organic light emitting layer between the first hole transport layer and the first electron transport layer. The second light emitting unit includes: a second hole transport layer and a second electron transport layer opposed to each other; and a second organic light emitting layer and a third organic light emitting layer between the second hole transport layer and the second electron transport layer. The first organic light emitting layer may be a blue fluorescent light emitting layer, the second organic light emitting layer may be a blue light emitting layer, and the third organic light emitting layer may be a yellow light emitting layer.

The second organic light emitting layer may include a first phosphorescent light-emitting material and the third organic light emitting layer may include a second phosphorescent light emitting material.

The second organic light emitting layer may include a fluorescent light emitting material and the third organic light emitting layer may include a phosphorescent light emitting material.

The organic light emitting diode display may further include an intermediate layer between the second organic light emitting layer and the third organic light emitting layer.

The third organic light emitting layer may include a yellow light emitting material.

The third organic light emitting layer may include a red light emitting layer and a green light emitting layer.

The third organic light emitting layer may include a host; and a red light emitting dopant and a green light emitting dopant dispersed in the host.

The charge generation layer may include an n-type layer configured to inject electrons and a p-type layer configured to inject holes.

The organic light emitting diode display may further include a color filter on the substrate.

The organic light emitting diode display may further include a color filter substrate on the second light emitting unit.

The color filter substrate may include: a base substrate; a plurality of color filters on the base substrate; and a black matrix configured to partition the plurality of color filters on a pixel-by-pixel basis.

According to another embodiment of the present invention, an organic light emitting diode includes: a first electrode and a second electrode opposed to each other; a first light emitting unit and a second light emitting unit between the first electrode and the second electrode; and a charge generation layer between the first light emitting unit and the second light emitting unit. The first light emitting unit includes: a first hole transport layer and a first electron transport layer opposed to each other; and a first organic light emitting layer between the first hole transport layer and the first electron transport layer. The second light emitting unit includes a second hole transport layer and a second electron transport layer opposed to each other; and a second organic light emitting layer and a third organic light emitting layer between the second hole transport layer and the second electron transport layer. The first organic light emitting layer may be a blue fluorescent light emitting layer, the second organic light emitting layer may be a blue light emitting layer, and the third organic light emitting layer may be a yellow light emitting layer.

The second organic light emitting layer may include a first phosphorescent light emitting material and the third organic light emitting layer may include a second phosphorescent light emitting material.

The second organic light emitting layer may include a fluorescent light emitting material and the third organic light emitting layer may include a phosphorescent light emitting material.

The organic light emitting diode may further include an intermediate layer between the second organic light emitting layer and the third organic light emitting layer.

The third organic light emitting layer may include a yellow light emitting material.

The third organic light emitting layer may include a red light emitting layer and a green light emitting layer.

The third organic light emitting layer may include: a host; and a red light emitting dopant and a green light emitting dopant dispersed in the host.

The charge generation layer may include an n-type layer configured to inject electrons and a p-type layer configured to inject holes.

The organic light emitting diode may be configured to emit white light having color temperature of about 6500K or more.

According to embodiments of the present invention, an organic light emitting diode may be configured to emit white light having a high color temperature. Further, according to embodiments of the present invention, an organic light emitting diode display may display a high-definition image using an organic light emitting diode that emits white light having a high color temperature.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
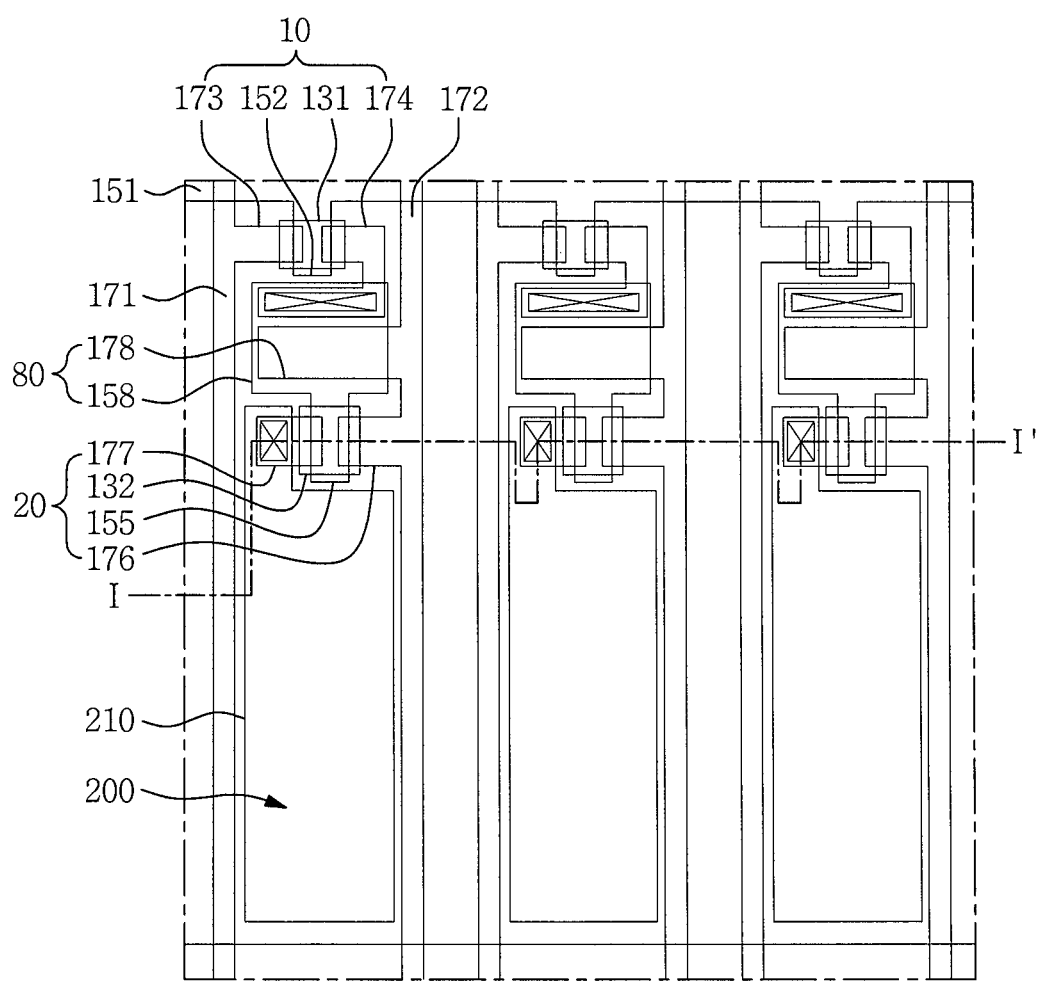
FIG. 1 is a plan view illustrating an organic light emitting diode display (OLED display) according to a first embodiment of the present invention.

Hereinafter, embodiments of the present disclosure of invention will be described in more detail with reference to the accompanying drawings.

All terminologies used herein are merely used to describe embodiments of the present invention and may be modified according to the relevant art and the intention of an applicant. Therefore, the terms used herein should be interpreted as having a meaning that is consistent with their meanings in the context of the present disclosure, and is not intended to limit the invention.

In the drawings, certain elements or shapes may be simplified or exaggerated to better illustrate the present invention, and other elements present in an actual product may also be omitted. Like reference numerals refer to like elements throughout the specification. Thus, the drawings are intended to facilitate the understanding of the present invention.

In addition, when a layer or element is referred to as being "on" another layer or element, the layer or element may be directly on the other layer or element, or one or more intervening layers or elements may be interposed therebetween.

Hereinafter, a first embodiment of the present invention is described with reference to FIGS. 1 and 2.

Figure 2:
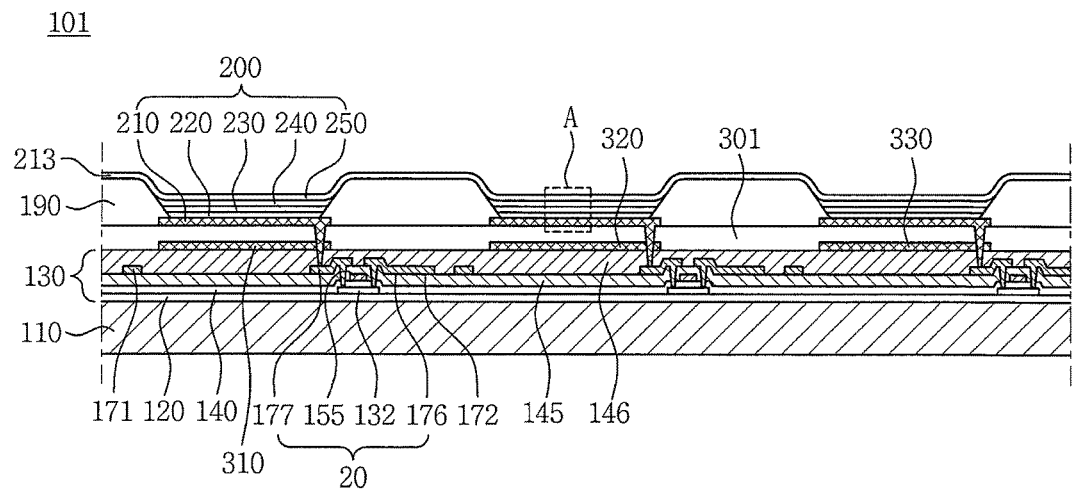
FIG. 2 is a cross-sectional view taken along line I-I' of FIG. 1.

FIG. 1 is a plan view illustrating an organic light emitting diode display (hereinafter an OLED display) 101 according to the first embodiment of the present invention and FIG. 2 is a cross-sectional view taken along line of FIG. 1.

As illustrated in FIGS. 1 and 2, the OLED display 101 according to the first embodiment of the present invention includes a substrate 110, a (conductive) line unit 130, an organic light emitting diode (hereinafter OLED) 200, and color filters 310, 320, and 330.

The substrate 110 may be made of an insulating material selected from the group consisting of glass, quartz, ceramic, and plastics, but embodiments of the present invention are not limited thereto. In some embodiments, the substrate 110 may be made of a metal material such as stainless steel.

A buffer layer 120 is disposed on the first substrate 110. The buffer layer 120 may include one or more layers selected from a variety of inorganic and organic layers. The buffer layer 120 is configured to prevent or mitigate infiltration of undesirable elements like moisture into the (conductive) line unit 130 or the OLED 200, and also to planarize a surface of the first substrate 110. However, the buffer layer 120 is not always necessary, and may be omitted in some embodiments.

The (conductive) line unit 130 is disposed on the buffer layer 120. The (conductive) line unit 130 includes a switching thin film transistor (hereinafter TFT) 10, a driving TFT 20, and a capacitor 80, and is configured drive the OLED 200. The OLED 200 emits light according to a driving signal supplied from the (conductive) line unit 130 to display an image.

FIGS. 1 and 2 illustrate an active-matrix (AM)-type OLED display 101 having a 2Tr-1Cap structure, which includes two TFTs 10 and 20 and a capacitor 80 in each pixel, but the first embodiment of the present invention is not limited thereto. In some embodiments, the OLED display 101 may have many different structures including three or more TFTs and two or more capacitors in one pixel, and may further include additional lines. Herein, the term "pixel"

refers to the smallest unit for displaying an image, and the OLED display 101 displays an image using a plurality of pixels.

Each pixel includes the switching TFT 10, the driving TFT 20, the capacitor 80, and the OLED 200. In addition, a gate line 151 arranged along one direction and a data line 171 and a common power line 172 insulated from and crossing the gate line 151 are also disposed on the (conductive) line unit 130. Herein, each pixel may be defined by the gate line 151, the data line 171, and the common power lines 172, but definitions of the pixel are not limited thereto. In some embodiments, a pixel may be defined by a pixel defining layer PDL or a black matrix.

The capacitor 80 includes a pair of capacitor plates 158 and 178 with an interlayer insulating layer 145 interposed therebetween. Herein, the interlayer insulating layer 145 is a dielectric (or dielectric material). Capacitance of the capacitor 80 may be determined by electric charge stored in the capacitor 80 and voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The semiconductor layers 131 and 132 and the gate electrodes 152 and 155 are insulated by a gate insulating layer 140.

The switching TFT 10 functions as a switching element which selects a pixel to perform light emission. The switching gate electrode 152 is connected to the gate line 151 and the switching source electrode 173 is connected to the data line 171. The switching drain electrode 174 is spaced apart from the switching source electrode 173 and is connected to one capacitor plate 158.

The driving TFT 20 applies a driving power to the first electrode 210 serving as a pixel electrode, which allows the OLED 200 in a selected pixel to emit light. The driving gate electrode 155 is connected to the one capacitor plate 158 that is connected to the switching drain electrode 174. The driving source electrode 176 and another capacitor plate 178 are respectively connected to the common power line 172. The driving drain electrode 177 is connected to the first electrode 210 of the OLED 200 through a contact hole.

With the above-described structure, the switching TFT 10 is operated by a gate voltage applied to the gate line 151 and functions to transmit a data voltage applied to the data line 171 to the driving TFT 20. Voltage equivalent to a difference between a common voltage applied from the common power line 172 to the driving TFT 20 and the data voltage transmitted from the switching TFT 10 is stored in the capacitor 80, and current corresponding to the voltage stored in the capacitor 80 flows to the OLED 200 through the driving TFT 20, such that the OLED 200 may emit light.

A protection layer 146 is disposed on the interlayer insulating layer 145. The protection layer 146 may be made of an insulating material and protect the (conductive) line unit 130. The protection layer 146 and the interlayer insulating layer 145 may be made of the same material.

The color filter is disposed on the protection layer 146. A red color filter 310, a green color filter 320, and a blue color filter 330 may be used as the color filter. Further, a planarization layer 301 is disposed on the color filters 310, 320, and 330 and the protection layer 146. The planarization layer 301 is configured to protect the color filters 310, 320, and 330 and to planarize a surface on which the first electrode 210 is disposed. The planarization layer 301 may be made of the same material as the protection layer 146.

However, embodiments of the present invention are not limited thereto. In some embodiments, the OLED display 101 according to the first embodiment of the present invention may further include a white color filter. In some embodiments, the color filters may be disposed between the substrate 110 and the (conductive) line unit 130 and may be disposed on a rear surface of the substrate 110.

The drain electrode 177 of the driving TFT 20 is connected to the first electrode 210 of the OLED 200 through a contact hole defined on the protection layer 146 and the planarization layer 301. In this case, the contact hole may pass through the color filters 310, 320, and 330.

The OLED 200 disposed on the OLED display 101 according to the first embodiment of the present invention is a white organic light emitting diode (WOLED) that emits white light. Further, the OLED 200 has a tandem structure where two light emitting units are connected in series to emit white light. In more detail, the OLED 200 includes a first electrode 210, a second electrode 250 disposed opposed to (or facing) the first electrode 210, first and second light emitting units 220 and 240 between the first and second electrodes 210 and 250, and a charge generation layer 230 between the first and second light emitting units 220 and 240. Further, the first and second light emitting units 220 and 240 include an organic light emitting layer.

A configuration of the OLED 200 is described below in more detail.

A hole and an electron are respectively injected from the first and second electrodes 210 and 250 into the first and second light emitting units 220 and 240. The hole and the electron are combined with each other to form an exciton, and the OLED emits light by energy generated when the exciton falls from an excited state to a ground state.

According to the first embodiment of the present invention, the first electrode 210 is an anode that injects a hole and the second electrode 250 is a cathode that injects an electron. However, embodiments of the present invention are not limited thereto, and thus the first electrode 210 may function as a cathode, and the second electrode 250 may function as an anode.

According to the first embodiment, the first electrode 210 is a transmissive electrode and the second electrode 250 is a reflective electrode. Accordingly, light generated from the first and second light emitting units 220 and 240 may be emitted through the first electrode 210 and the color filters 310, 320, and 330. As such, the OLED display 101 according to the first embodiment of the present invention has a bottom-emission type structure.

The first electrode 210, which is a transmissive electrode, may include a transparent conductive oxide (TCO). The transparent conductive oxides (TCOs) include, for example, indium tin oxide (ITO), indium zinc oxide (IZO), zinc oxide (ZnO), aluminum zinc oxide (AZO), and indium oxide ($In_2O_3$). Such transparent conductive oxides (TCOs) may be used solely or in combination with each other. The transparent conductive oxide (TCO) may have a relatively high work function. Therefore, when the first electrode 210 includes the transparent conductive oxides (TCOs), the hole injection through the first electrode 210 is more efficiently carried out.

The second electrode 250, which is a reflective electrode, may include at least one metal of magnesium (Mg), silver (Ag), gold (Au), calcium (Ca), lithium (Li), chromium (Cr), copper (Cu) and aluminum (Al), or metal alloys thereof.

A pixel defining layer 190 has an aperture. A part of the first electrode 210 is exposed through the aperture of the pixel defining layer 190. On the exposed first electrode 210, organic light emitting layers of the first and second light emitting units 220 and 240 are disposed. The second electrode 250 is laminated on the first and second light emitting units 220 and 240, and further disposed on the pixel defining layer 190. Accordingly, the pixel defining layer 190 may define a light emission area.

Although not illustrated, a capping layer may be disposed on the second electrode 250. The capping layer protects the OLED 200. Further, a thin film encapsulation layer (not illustrated) may be disposed on the second electrode 250 in order to protect the OLED 200. The thin film encapsulation layer has a structure where at least one organic layer and at least one inorganic layer are alternately disposed, thereby preventing or mitigating infiltration of external air (e.g., moisture or oxygen) into the OLED 200.

The OLED display 101 according to the first embodiment of the present invention displays red, green, and blue colors or emits light having red, green, and blue colors using the color filters 310, 320, and 330 disposed toward a light-emitting direction of the OLED 200. The color filters 310, 320, and 330 are disposed in a light emission area. As such, each color filter 310, 320, or 330 is disposed to overlap the first electrode 210 of the OLED 200. In FIG. 1, each color filter 310, 320, or 330 is disposed under the first electrode 210.

The red color filter 310 has a reddish color, the green color filter 320 has a greenish color, and the blue color filter 330 has a bluish color.

The red color filter 310 includes a red pigment, the green color filter 320 includes a green pigment, and the blue color filter 330 includes a blue pigment. Pigments known to and commonly used by those skilled in the art for manufacturing color filters can be used as the red, green, and blue pigments. For example, a reddish C.I. pigment can be used as the red pigment, a greenish C.I. pigment can be used as the green pigment, and a phthalocyanine-base pigment or an indanthrone blue pigment can be used as the blue pigment.

Hereinafter, a second embodiment of the present invention is described with reference to FIG. 3. The descriptions of the above-described configurations according to the first embodiment will not be provided to reduce repetition.

Figure 3:
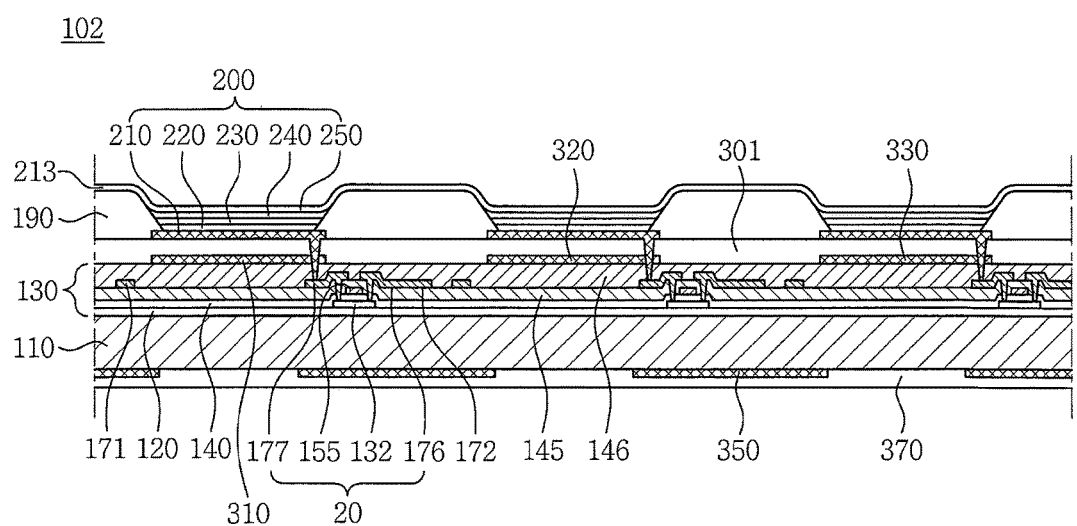
FIG. 3 is a cross-sectional view illustrating an OLED display according to a second embodiment of the present invention.

FIG. 3 is a cross-sectional view illustrating an OLED display 102 according to a second embodiment of the present invention.

The OLED display 102 according to the second embodiment of the present invention includes a black matrix 350 disposed on a rear surface of a substrate 110, which is the opposite side of a surface on which a (conductive) line unit 130 is disposed. The black matrix 350 is configured to partition or separate red, green, and blue color filters 310, 320 and 330 on a pixel-by-pixel basis (e.g., the black matrix 350 is located between the red, green, and blue color filters 310, 320, and 330 along the plane of the substrate 110).

The black matrix 350 is disposed on a non-light emission area of the substrate 110. The black matrix 350 spatially corresponds to a pixel defining layer 190. An aperture defined by the black matrix 350 defines an area where light emitted from the OLED 200 is released outwards through the color filters 310, 320, and 330. As such, the black matrix 350 defines a light emission area.

The black matrix 350 may be made of, for example, metal or metal compounds. The metal includes chromium (Cr) and the like, and the metal compounds include chromium oxides (CrOx), chromium nitrides (CrNx), and the like. Further, the black matrix 350 may be made of an opaque photo-sensitive organic material. The opaque photo-sensitive organic material may include, for example, carbon black, pigment mixtures, or dye mixtures.

A passivation layer 370 is disposed on the black matrix 350 so as to protect the black matrix 350. The passivation layer 370 may be made of the same material as the buffer layer 120.

Hereinafter, a third embodiment of the present invention is described with reference to FIG. 4. The descriptions of the above-described configurations will not be provided to avoid or reduce repetition.

Figure 4:
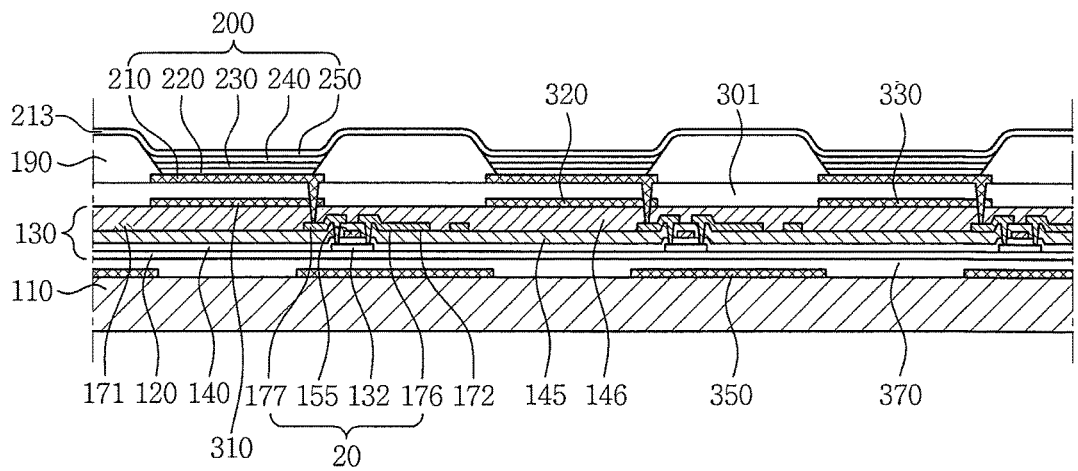
FIG. 4 is a cross-sectional view illustrating an OLED display according to a third embodiment of the present invention.

FIG. 4 is a cross-sectional view illustrating an OLED display 103 according to the third embodiment of the present invention.

The OLED display 103 according to the third embodiment of the present invention includes a black matrix 350 disposed between a substrate 110 and a color filter layer 300. In more detail, the black matrix 350 is disposed between the substrate 110 and the (conductive) line unit 130.

As such, the black matrix 350 is disposed on the substrate 110, a passivation layer 370 is disposed on the black matrix 350, a buffer layer 120 is disposed on the passivation layer 370, and the (conductive) line unit 130 is disposed on the buffer layer 120. In this case, the passivation layer 370 may be made of the same material as the buffer layer 120 and one of the passivation layer 370 and the buffer layer 120 may be omitted.

Hereinafter, a fourth embodiment of the present invention is described with reference to FIG. 5. The descriptions of the above-described configurations will not be provided in order to avoid repetition.

Figure 5:
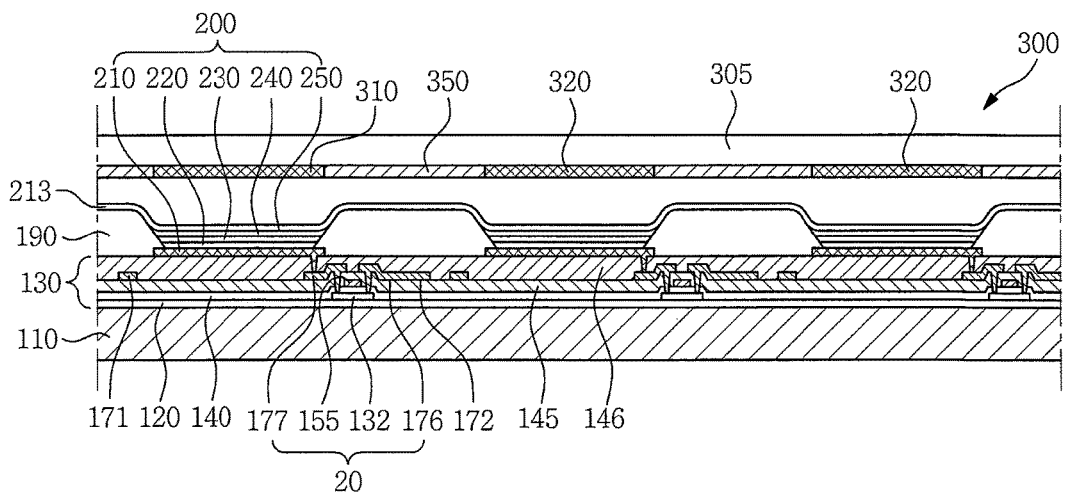
FIG. 5 is a cross-sectional view illustrating an OLED display according to a fourth embodiment of the present invention.

FIG. 5 is a cross-sectional view illustrating an OLED display 104 according to the fourth embodiment of the present invention.

The OLED display 104 according to the fourth embodiment of the present invention includes a color filter substrate 300 spaced apart from an OLED.

In more detail, the OLED display 104 according to the fourth embodiment of the present invention includes a buffer layer 120 on a substrate 110, a (conductive) line unit 130 on the buffer layer 120, and a protection layer 146 on the (conductive) line unit 130. Color filters are not disposed on the protection layer 146 and the first electrode 210 is disposed on the (conductive) line unit 130.

Herein, the first electrode 210 is a reflective electrode and a second electrode 250 is a transflective electrode. Accordingly, light generated from the first and second light emitting units 220 and 240 is emitted through the second electrode 250. As such, the OLED display 104 according to the fourth embodiment of the present invention has a top-emission type structure.

One or more metals such as magnesium (Mg), silver (Ag), gold (Au), calcium (Ca), lithium (Li), chromium (Cr), and aluminum (Al) or a metal alloy thereof may be used to form the reflective electrode and the transflective electrode. Generally, the transflective electrode has a thickness less than 200 nm. Light transmittance is increased as the thickness of the transflective electrode is reduced, whereas light transmittance is reduced as the thickness thereof is increased.

In more detail, the first electrode 210 may include a reflective layer including one or more metals such as magnesium (Mg), silver (Ag), gold (Au), calcium (Ca), lithium (Li), chromium (Cr), copper (Cu) and aluminum (Al) and a transparent conductive layer disposed on the reflective layer. As such, the first electrode 210 may have a multi-layer structure including a reflective layer and a transparent conductive layer 212. The transparent conductive layer is disposed between the reflective layer and an organic light emitting layer.

The transparent conductive layer may include transparent conductive oxides (TCOs). The TCO may include at least one of indium tin oxide (ITO), indium zinc oxide (IZO), zinc oxide (ZnO), aluminum zinc oxide (AZO), and indium oxide ($In_2O_3$). The TCO may have a relatively high work function. Accordingly, when the first electrode 210 includes the transparent conductive layer, the hole injection through the first electrode 210 is more efficiently carried out.

In addition, the first electrode 210 may have a triple-layer structure where a transparent conductive layer, a reflective layer, and a transparent conductive layer are sequentially laminated.

The second electrode 250 is made of a transflective layer including one or more metal of magnesium (Mg), silver (Ag), gold (Au), calcium (Ca), lithium (Li), chromium (Cr), copper (Cu), and aluminum (Al).

A color filter substrate 300 is spaced apart from the second electrode 250 and disposed on the second electrode 250. Color filters 310, 320, and 330 are disposed on the color filter substrate 300.

In more detail, the color filter substrate 300 includes a base substrate 305, red, green, and blue color filters 310, 320 and 330 on the base substrate 305, and a black matrix 350 configured to partition the red, green, and blue color filters 310, 320 and 330 on a pixel-by-pixel basis (e.g., the black matrix 350 is located between the red, green, and blue color filters 310, 320, and 330).

Although not illustrated, an insulation layer may be disposed on the color filters 310, 320, and 330 and the black matrix 350. The insulating layer may be made of an inorganic insulating material or an organic insulating material. The insulating layer is configured to prevent or mitigate exposure of the color filters 310, 320, and 330 (e.g., exposure to the outside environment), and provide a flat surface.

Hereinafter, an OLED is described below in more detail with reference to FIGS. 6, 7, 8, 9, and 10. The OLED illustrated in FIGS. 6, 7, 8, 9, and 10 can be applied to the OLED display according to the first to fourth embodiments of the present invention. The OLED corresponds to, for example, "A" portion illustrated in FIG. 2.

Figure 6:
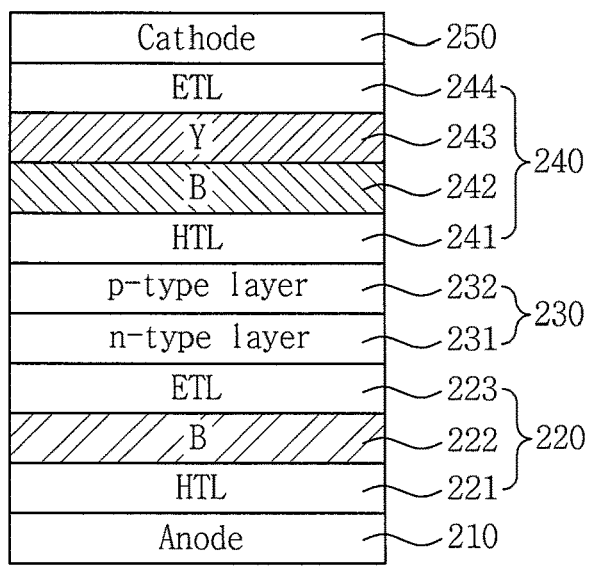
FIG. 6 is a cross-sectional view illustrating an organic light emitting diode (OLED) according to a fifth embodiment of the present invention.

FIG. 6 is a cross-sectional view illustrating an OLED 105 according to a fifth embodiment of the present invention.

The OLED 105 according to the fifth embodiment of the present invention has a tandem structure where two light emitting units 220 and 240 are connected in series to emit white light. In more detail, the OLED 105 includes first and second electrodes 210 and 250 opposed to (or facing) each other, the first and second light emitting units 220 and 240 between the first and second electrodes 210 and 250, and a charge generation layer 230 between the first and second light emitting units 220 and 240.

Herein, the first electrode 210 is an anode and the second electrode 250 is a cathode. Further, the first light emitting unit 220 is disposed adjacent to the first electrode 210 and the second light emitting unit 240 is disposed adjacent to the second electrode 250.

The first light emitting unit 220 includes a first hole transport layer 221 and a first electron transport layer 223 disposed opposed to (or facing) each other, and a first organic light emitting layer 222 disposed between the first hole transport layer 221 and the first electron transport layer 223. FIG. 6 illustrates a structure where the first electrode, the first hole transport layer 221, the first organic light emitting layer 222, and the first electron transport layer 223 are sequentially disposed.

The second light emitting unit 240 includes a second hole transport layer 241 and a second electron transport layer 244 disposed opposed to (or facing) each other, and a second organic light emitting layer 242 and a third organic light emitting layer 243 disposed between the second hole transport layer 241 and the second electron transport layer 244. FIG. 6 illustrates a structure where the second hole transport layer 241, the second organic light emitting layer 242, the third organic light emitting layer 243, the second electron transport layer 244, and the second electrode 250 are sequentially disposed.

The first organic light emitting layer 222 of the OLED 105 according to the fifth embodiment of the present invention is a blue fluorescent light emitting layer. As such, the first organic light emitting layer 222 includes a blue fluorescent light emitting material.

Further, the second organic light emitting layer 242 is a blue light emitting layer, and the third organic light emitting layer 243 is a yellow light emitting layer. Herein, the second and third organic light emitting layers 242 and 243 include a phosphorescent light emitting material (e.g., the second and third light emitting layers may include different phosphorescent light emitting materials). As such, the blue and yellow light emitting layers of the second light emitting unit 240 are all phosphorescent light emitting layers.

Because the second and third organic light emitting layers 242 and 243 are all phosphorescent light emitting layers, quenching does not occur between light emitting layers. Accordingly, an additional intermediate layer is not required between the second and third organic light emitting layers 242 and 243. As such, without an additional element, the second light emitting unit 240 can be easily formed by simply laminating the second and third light emitting layers 242 and 243.

Meanwhile, the third organic light emitting layer 243 may include a yellow light emitting material. As such, the third organic light emitting layer 243 may be formed of a single light emitting layer including a yellow light emitting material. A yellow light emitting material used by those skilled in the art can be used as the yellow light emitting material.

When expressing colors with the white OLED and the red, green, and blue color filters, light emitted from the white OLED has each light emission peak in respective red, green, and blue wavelength ranges so as to display red, green, and blue colors.

The third organic light emitting layer 243 may have a multi-layer structure and may include, for example, a red light emitting layer and a green light emitting layer. In this case, light emitted from the OLED 105 may have light emission peaks in the red and green wavelength ranges. A red light emitting material and a green light emitting material used by those skilled in the pertinent art may be respectively used to form the red and green light emitting layers.

Further, the third organic light emitting layer 243 may include a host and red light emitting dopants and green light emitting dopants dispersed in the host. Materials used by those skilled in the pertinent art may be used as the host and the dopants. In this case, light emitted from the OLED 105 may have a light emission peaks in the red and green wavelength ranges.

A charge generation layer 230 is disposed between the first and second light emitting units 220 and 240. The charge generation layer (CGL) 230 is disposed between the light emitting units 220 and 240 to adjust charges between the light emitting units 220 and 240, thereby achieving charge balance. The charge generation layer 230 is disposed adjacent to the first light emitting unit 220 and includes an n-type layer 231 that provides electrons to the first light emitting unit 220 and a p-type layer 232 that provides holes to the second light emitting unit 240.

The charge generation layer may be formed of metal such as aluminum (Al) or transparent conductive materials such as indium tin oxide (ITO).

Further, an organic material may be doped by adding n-type and p-type materials to form the charge generation layer 230. In more detail, an organic material may be doped with an n-type material to form an n-type layer 231 in order to efficiently provide electrons, and an organic material may be doped with a p-type material to form a p-type layer 232 in order to efficiently provide holes.

When voltage is applied across the first and second electrodes 210 and 250 of the OLED 105 having the above-described structure, electrons are generated from the n-type layer 231 and transmitted to the first light emitting unit 220 and holes are injected from the first electrode 210 to the first light emitting unit 220. The electrons and holes are combined in the first light emitting unit 220, thereby emitting light.

Further, electrons are injected from the second electrode 250 to the second light emitting unit 240 and holes are generated from the p-type layer 232 and transmitted to the second light emitting unit 240. The electrons and holes are combined in the second light emitting unit 240, thereby emitting light.

Meanwhile, a hole injection layer HIL may be disposed between the first electrode 210 and the first hole transport layer 221. Further, an electron injection layer EIL may be further disposed between the second electron transport layer 244 and the second electrode 250.

The OLED 105 according to the fifth embodiment of the present invention includes at least two blue light emitting layers 222 and 242 and at least one yellow light emission layer 243 disposed in the first and second light emitting units 220 and 240, and thus may emit white light having color temperature of about 6500K or more. The OLED 105 according to the fifth embodiment of the present invention may adjust light intensity of the blue light emitting layers 222 and 242 and the yellow light emitting layer 243 to emit white light having color temperature in a range from about 6500K to about 10000K.

Figure 7:
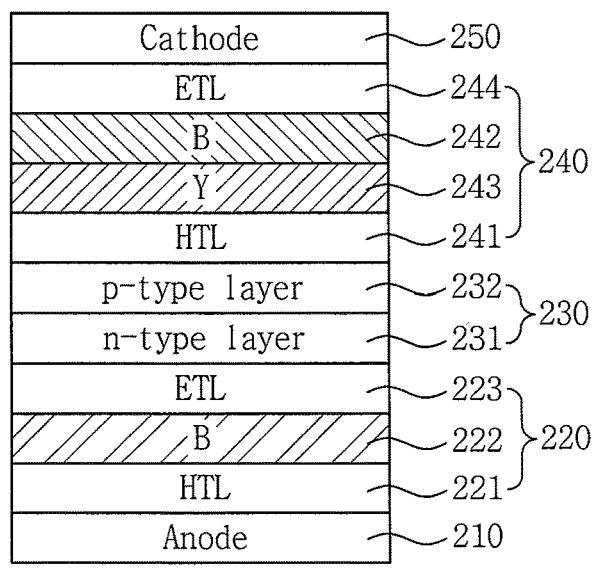
FIG. 7 is a cross-sectional view illustrating an OLED according to a sixth embodiment of the present invention.

FIG. 7 is a cross-sectional view illustrating an OLED 106 according to a sixth embodiment of the present invention.

The OLED 106 according to the sixth embodiment of the present invention has substantially the same structure as the OLED 105 according to the fifth embodiment of the present invention, except that a lamination order of a second light emitting layer 242, which is a blue light emitting layer, and a third light emitting layer 243, which is a yellow light emitting layer, of a second light emitting unit 240 is changed (or reversed).

Figure 8:
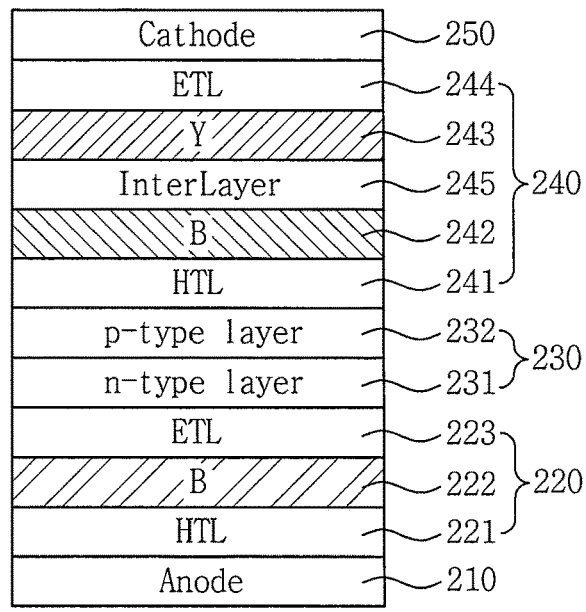
FIG. 8 is a cross-sectional view illustrating an OLED according to a seventh embodiment of the present invention.

FIG. 8 is a cross-sectional view illustrating an OLED 107 according to a seventh embodiment of the present invention.

In the OLED 107 according to the seventh embodiment of the present invention, a second light emitting layer 242 of a second organic light emitting unit 240 (e.g., a blue light emitting layer) includes a fluorescent light emitting material, and a third light emitting layer 243 thereof (e.g., a yellow light emitting layer) includes a phosphorescent light emitting material.

In the OLED 107 according to the seventh embodiment of the present invention, the blue light emitting layer is a fluorescent layer and a yellow light emitting layer is a phosphorescent light emitting layer. When a fluorescent light emitting layer and a phosphorescent light emitting layer are in contact with each other accordingly, charge quenching occurs, thereby decreasing light emission efficiency. Therefore, in the OLED 107 according to the seventh embodiment of the present invention, an intermediate layer (or interlayer) 245 is interposed between the second light emitting layer 242 serving as a fluorescent light emitting layer and the third light emitting layer 243 serving as a phosphorescent light emitting layer. The intermediate layer is formed of a material that can transport holes and charges.

Figure 9:
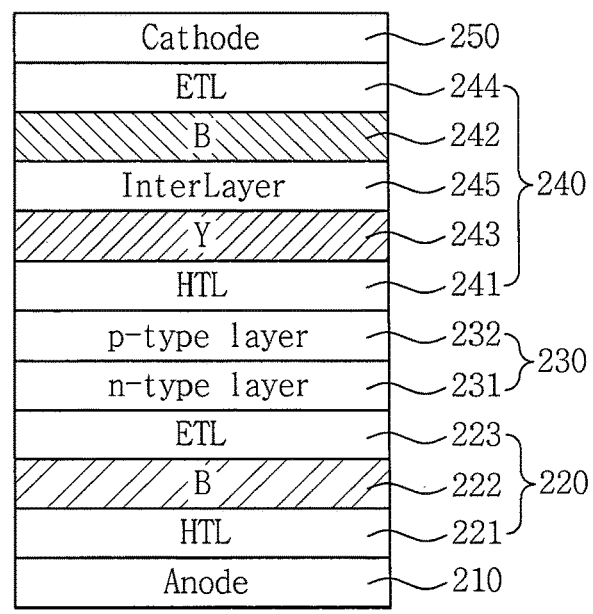
FIG. 9 is a cross-sectional view illustrating an OLED according to an eighth embodiment of the present invention.

FIG. 9 is a cross-sectional view illustrating an OLED 108 according to an eighth embodiment of the present invention.

The OLED 108 according to the eighth embodiment of the present invention has substantially the same structure as the OLED 107 according to the seventh embodiment of the present invention, except that a lamination order of a second light emitting layer 242 and a third light emitting layer 243 of a second light emitting unit 240 is changed (or reversed).

Figure 10:
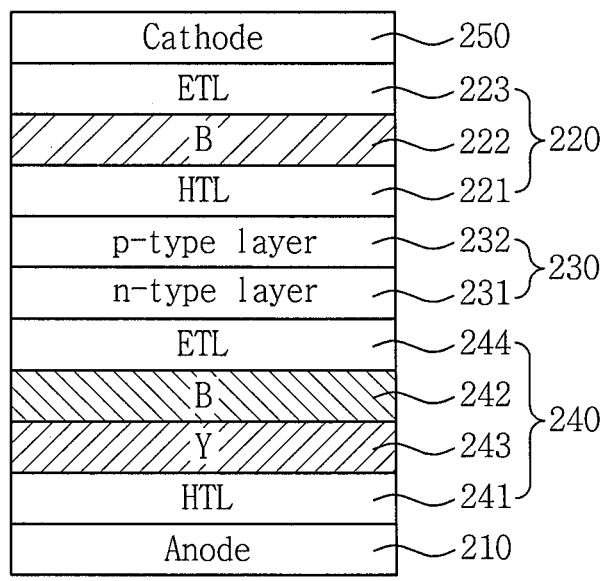
FIG. 10 is a cross-sectional view illustrating an OLED according to a ninth embodiment of the present invention.

FIG. 10 is a cross-sectional view illustrating an OLED 109 according to a ninth embodiment of the present invention.

The OLED 109 according to the ninth embodiment of the present invention has the same structure as the OLED 106 according to the sixth embodiment of the present invention, except that a lamination order of first and second light emitting units 220 and 240 is changed (or reversed).

In more detail, the OLED 109 according to the ninth embodiment of the present invention includes a first electrode 210 on a substrate 110, a second light emitting unit 240 on the first electrode 210, a charge generation layer 230 on the second light emitting unit 240, a first light emitting unit on the charge generation layer 230, and a second electrode 250 on the first light emitting unit 220.

The second light emitting unit 240 includes a second hole transport layer 241 on the first electrode 210, a third light emitting layer 243 on the second hole transport layer 241, a second light emitting layer 242 on the third light emitting layer 243, and a second electron transport layer 244 on the second light emitting layer 242.

The first light emitting unit 220 includes a first hole transport layer 221 on the charge generation layer 230, a first organic light emitting layer 222 on the first hole transport layer 221, a first electron transport layer 223 on the first organic light emitting layer 222. Herein, the first organic light emitting layer 222 is a blue fluorescent light emitting layer.

In order to express high-definition colors with the OLED display that displays an image using the white OLED, the white OLED has a high color temperature. More particularly, a white color displayed in recent display devices may have a very high color temperature of about 9000K.

White color is generally realized by combination of red and green colors or blue and yellow colors. A blue color has light emission efficiency relatively lower than that of red or green colors, thereby having difficulty in expressing a white color having a high color temperature.

Figure 11:
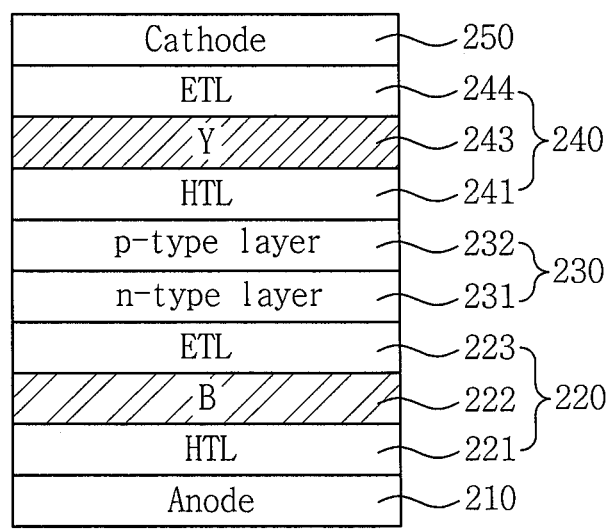
FIG. 11 is a cross-sectional view illustrating a conventional white OLED having a tandem structure.

FIG. 11 is a cross-sectional view illustrating a conventional white OLED having a tandem structure. The OLED illustrated in FIG. 11 includes first and second electrodes 210 and 250 opposed to (or facing) each other, first and second light emitting units 220 and 240 between the first and second electrodes 210 and 220, and a charge generation layer 230 between the first and second light emitting units 220 and 240. Further, the first light emitting unit 220 includes a blue light emitting layer 222 and the second light emitting unit 240 includes a yellow light emitting layer 243.

Figure 12A:
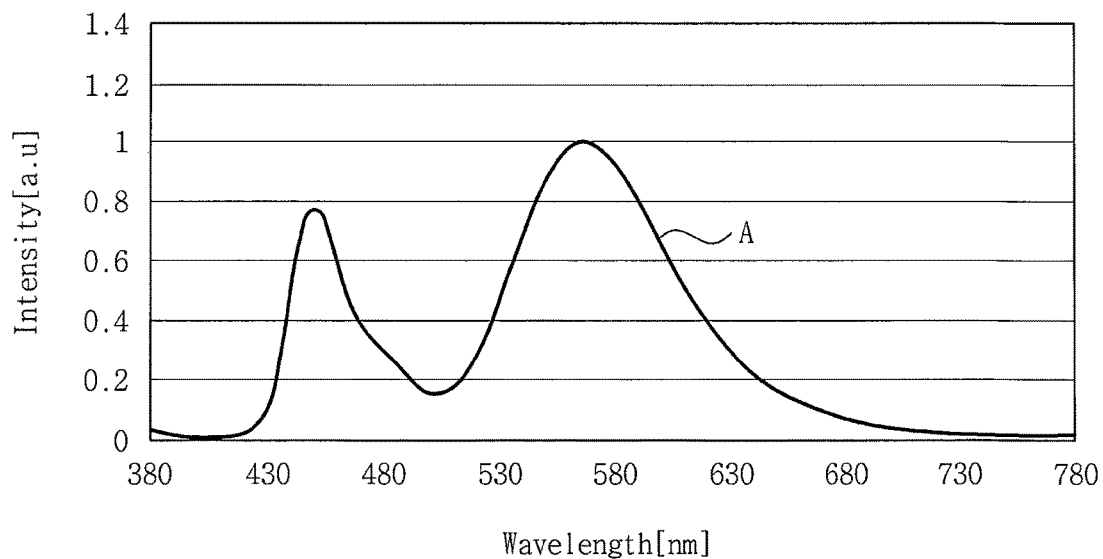
FIGS. 12A, 12B, and 12C are light emission graphs of a white OLED.

FIG. 12A illustrates a general light emission spectrum A of a white OLED having a structure illustrated in FIG. 11. Referring to FIG. 12A, a blue color with a peak at about 450 nm has lower light intensity than a yellow color with a peak at about 570 nm. Accordingly, the white OLED having a structure illustrated in FIG. 11 emits white light that is similar to a yellow color.

Figure 13A:
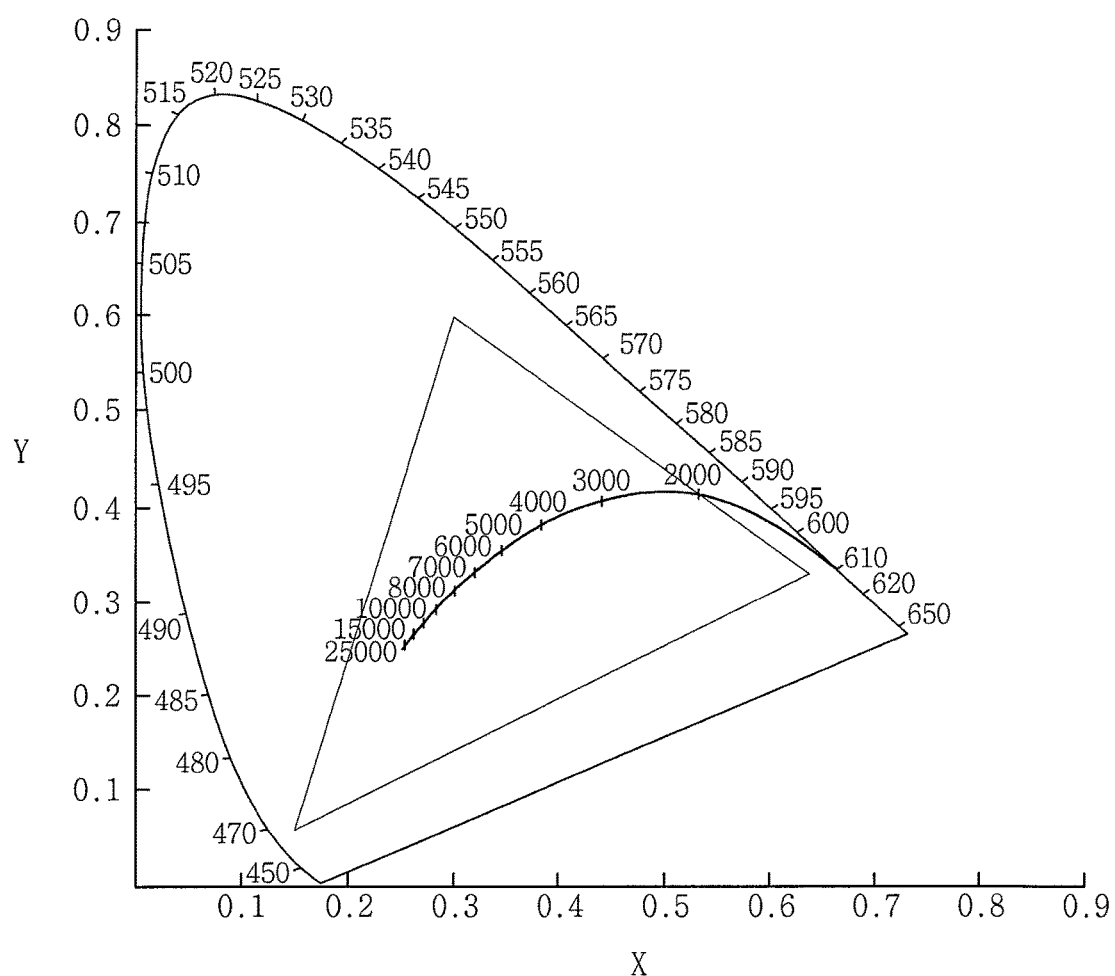
FIGS. 13A and 13B are CIE 1931 chromaticity diagrams.
Figure 13B:
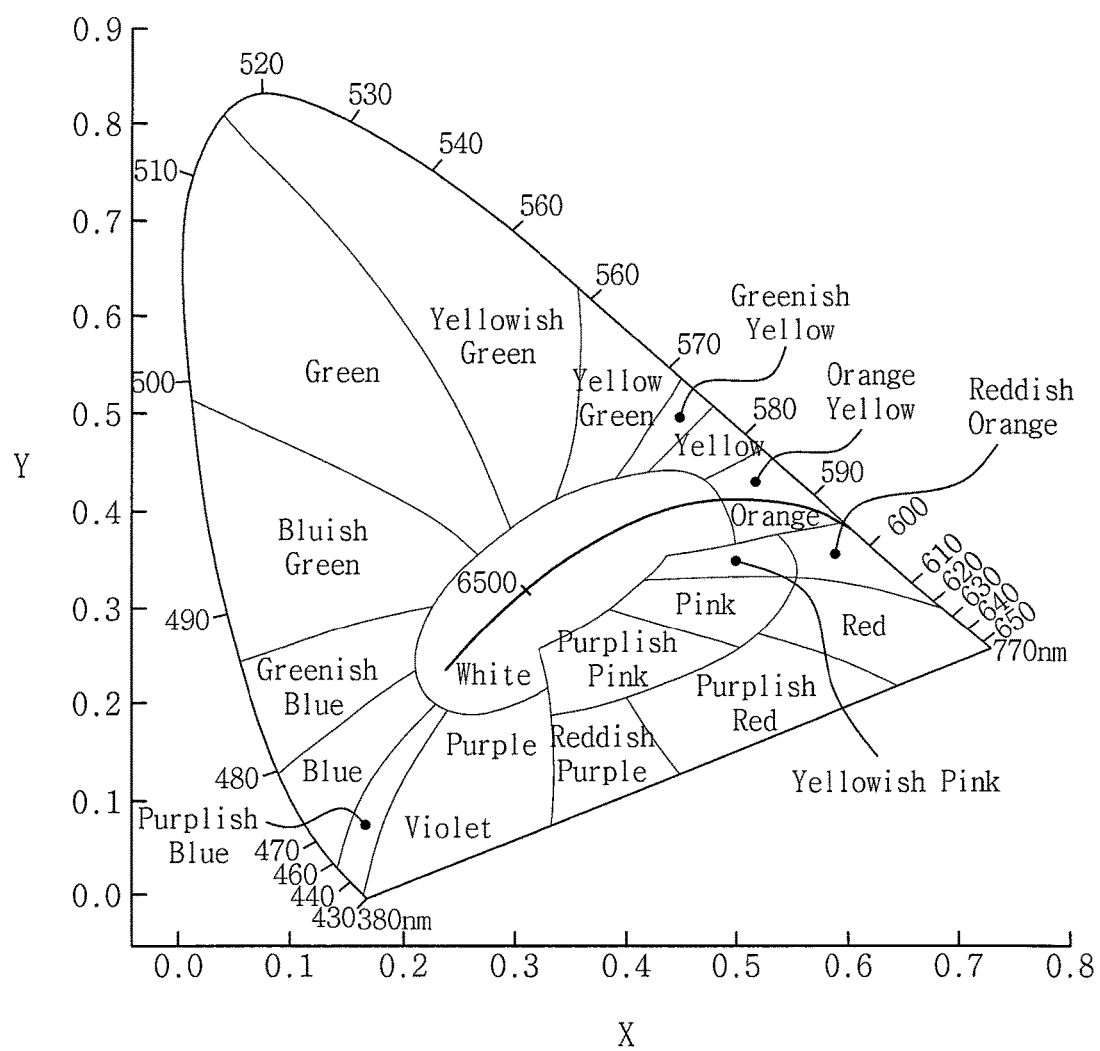

FIGS. 13A and 13B are CIE 1931 chromaticity diagrams. Based on the CIE 1931 chromaticity diagram, a white color emitted from the white OLED having a structure illustrated in FIG. 11 has chromaticity coordinates of x=0.36 and y=0.39. The white light having the chromaticity coordinates exhibits a yellow-biased color and has color temperature less than 6500K.

Figure 12B:
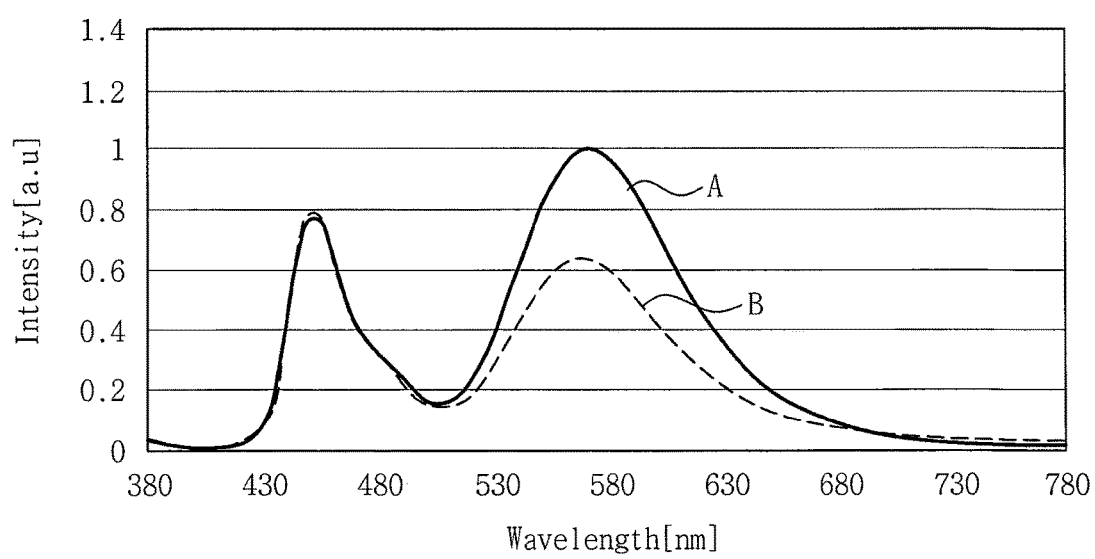

In order to increase color temperature of the white OLED, light intensity of a yellow color may be reduced. FIG. 12B illustrates the light emission spectrum A of the conventional white OLED and a light emission spectrum B of a white OLED that has a reduced light intensity for the yellow color. When the light intensity of the yellow color is lowered, balance of blue and yellow colors is adjusted to produce white light having a higher color temperature, but decrease efficiency of the OLED.

An OLED according to an embodiment of the present invention includes a blue light emitting layer 242 disposed on a second light emitting unit 240, in addition to a blue light emitting layer 222 disposed on a first light emitting unit 220. Such OLED according to an embodiment of the present invention shows improved or increased light intensity of a blue color, thereby emitting white light having a higher color temperature.

Figure 12C:
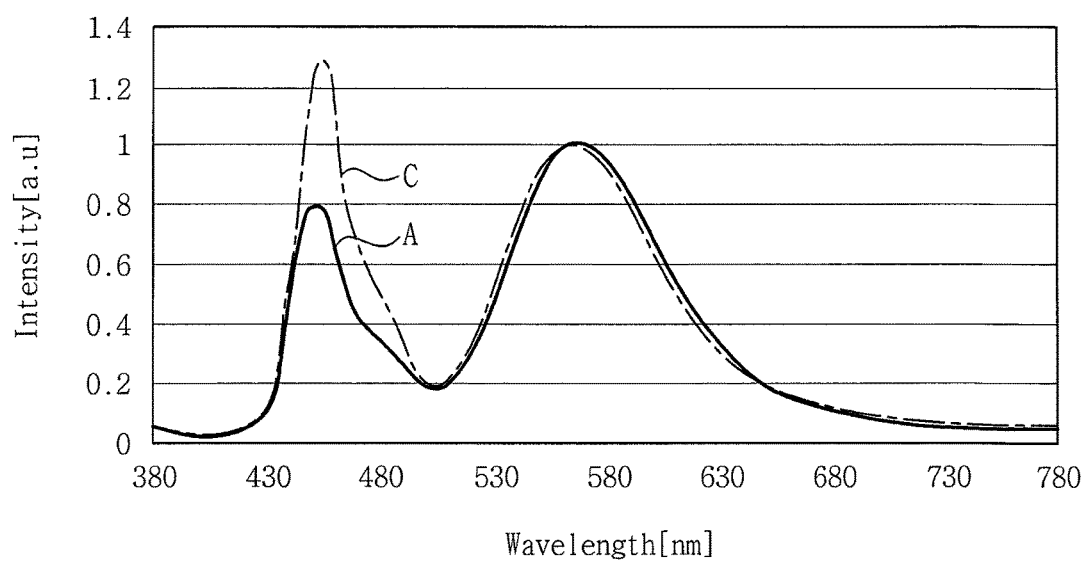

In more detail, when the blue light emitting layer 242 is further provided to the second light emitting unit 240, light intensity of a blue color is improved, such that the OLED may have a light emission spectrum C illustrated in FIG. 12C. In this case, white light emitted from the OLED shows chromaticity coordinates transferred toward a blue color having a higher color temperature according to the CIE 1931 chromaticity diagrams.

In more detail, white light emitted from the OLED 105 according to the fifth embodiment of the present invention may have chromaticity coordinates of x=0.33 and y=0.33, and may have chromaticity coordinates further transferred toward lower left. The white light emitted from the OLED 105 according to the fifth embodiment of the present invention may have a higher color temperature compared to the white light emitted from the white OLED having a structure illustrated in FIG. 11.

Accordingly, the OLED according to an embodiment of the present invention can emit white light having a high color temperature, and is thereby capable of expressing high-definition colors.

From the foregoing, it will be appreciated that various embodiments in accordance with the present disclosure have been described herein for purposes of illustration, and that various modifications may be made without departing from the scope and spirit of the present teachings and equivalents thereof. Accordingly, the various embodiments disclosed herein are not intended to be limiting of the true scope and spirit of the present teachings.

What is claimed is:

1. An organic light emitting diode display comprising:
a substrate;
a first electrode on the substrate;
a second electrode opposed to the first electrode;
a first light emitting unit and a second light emitting unit between the first electrode and the second electrode; and
a charge generation layer between the first light emitting unit and the second light emitting unit, wherein the charge generation layer comprises an n-type layer configured to inject electrons and a p-type layer configured to inject holes,
the first light emitting unit comprising:
a first hole transport layer and a first electron transport layer opposed to each other; and
a first organic light emitting layer between the first hole transport layer and the first electron transport layer, wherein the first organic light emitting layer is a first blue fluorescent light emitting layer, and
the second light emitting unit comprising:
a second hole transport layer and a second electron transport layer opposed to each other;
a second organic light emitting layer and a third organic light emitting layer between the second hole transport layer and the second electron transport layer, the second organic light emitting layer contacting the second hole transport layer and the third organic light emitting layer contacting the second electron transport layer, wherein the second organic light emitting layer is a second blue fluorescent light emitting layer and the third organic light emitting layer is a yellow phosphorescent light emitting layer; and
an intermediate layer configured to prevent charge quenching between the second blue fluorescent light emitting layer and the yellow phosphorescent light emitting layer.

2. The organic light emitting diode display of claim 1, wherein the intermediate layer is formed of a non-fluorescent and non-phosphorescent material that can transport holes and charges.

3. The organic light emitting diode display of claim 1, wherein the second organic light emitting layer comprises a fluorescent light emitting material and the third organic light emitting layer comprises a phosphorescent light emitting material.

4. The organic light emitting diode display of claim 1, wherein the third organic light emitting layer comprises a yellow light emitting material.

5. The organic light emitting diode display of claim 1, wherein the third organic light emitting layer comprises a red light emitting layer and a green light emitting layer.

6. The organic light emitting diode display of claim 1, wherein the third organic light emitting layer comprises:
a host; and
a red light emitting dopant and a green light emitting dopant dispersed in the host.

7. The organic light emitting diode display of claim 1, further comprising a color filter on the substrate.

8. The organic light emitting diode display of claim 1, further comprising a color filter substrate on the second light emitting unit.

9. The organic light emitting diode display of claim 8, wherein the color filter substrate comprises:
a base substrate;
a plurality of color filters on the base substrate; and
a black matrix configured to partition the plurality of color filters on a pixel-by-pixel basis.

10. An organic light emitting diode comprising:
a first electrode and a second electrode opposed to each other;
a first light emitting unit and a second light emitting unit between the first electrode and the second electrode; and
a charge generation layer between the first light emitting unit and the second light emitting unit, wherein the charge generation layer comprises an n-type layer configured to inject electrons and a p-type layer configured to inject holes,
the first light emitting unit comprising:
a first hole transport layer and a first electron transport layer opposed to each other; and
a first organic light emitting layer between the first hole transport layer and the first electron transport layer, wherein the first organic light emitting layer is a first blue fluorescent light emitting layer, and
the second light emitting unit comprising:
a second hole transport layer and a second electron transport layer opposed to each other;
a second organic light emitting layer and a third organic light emitting layer between the second hole transport layer and the second electron transport layer, the second organic light emitting layer contacting the second hole transport layer and the third organic light emitting layer contacting the second electron transport layer, wherein the second organic light emitting layer is a second blue fluorescent light emitting layer and the third organic light emitting layer is a yellow phosphorescent light emitting layer; and
an intermediate layer configured to prevent charge quenching between the second blue fluorescent light emitting layer and the yellow phosphorescent light emitting layer.

11. The organic light emitting diode of claim 10, wherein the intermediate layer is formed of a non-fluorescent and non-phosphorescent material that can transport holes and charges.

12. The organic light emitting diode of claim 10, wherein the second organic light emitting layer comprises a fluorescent light emitting material and the third organic light emitting layer comprises a phosphorescent light emitting material.

13. The organic light emitting diode of claim 10, wherein the third organic light emitting layer comprises a yellow light emitting material.

14. The organic light emitting diode of claim 10, wherein the third organic light emitting layer comprises a red light emitting layer and a green light emitting layer.

15. The organic light emitting diode of claim 10, wherein the third organic light emitting layer comprises:
a host; and
a red light emitting dopant and a green light emitting dopant dispersed in the host.

16. The organic light emitting diode of claim 10, wherein the organic light emitting diode is configured to emit white light having color temperature of about 6500K or more.

17. The organic light emitting diode of claim 10, wherein the organic light emitting diode is configured to emit white light having color temperature of about 9000K or more.

* * * * *